United States Patent
Matsumoto et al.

(10) Patent No.: US 8,576,565 B2
(45) Date of Patent: Nov. 5, 2013

(54) ELECTRONIC DEVICE COOLING STRUCTURE

(75) Inventors: Subaru Matsumoto, Osaka (JP); Kou Komori, Nara (JP); Yasufumi Takahashi, Osaka (JP)

(73) Assignee: Panasonic Corporation, Osaka (JP)

( * ) Notice: Subject to any disclaimer, the term of this patent is extended or adjusted under 35 U.S.C. 154(b) by 203 days.

(21) Appl. No.: 13/265,281

(22) PCT Filed: Aug. 17, 2010

(86) PCT No.: PCT/JP2010/005086
§ 371 (c)(1),
(2), (4) Date: Oct. 19, 2011

(87) PCT Pub. No.: WO2011/021384
PCT Pub. Date: Feb. 24, 2011

(65) Prior Publication Data
US 2012/0033381 A1     Feb. 9, 2012

(30) Foreign Application Priority Data
Aug. 18, 2009   (JP) .................................. 2009-188969

(51) Int. Cl.
*H05K 7/20*         (2006.01)
(52) U.S. Cl.
USPC ............ 361/697; 361/690; 361/694; 361/695
(58) Field of Classification Search
None
See application file for complete search history.

(56) References Cited

U.S. PATENT DOCUMENTS

| | | | | |
|---|---|---|---|---|
| 5,424,915 A | * | 6/1995 | Katooka et al. | 361/695 |
| 6,205,025 B1 | * | 3/2001 | Chen | 361/704 |
| 6,488,126 B1 | | 12/2002 | Yamakawa et al. | |
| 6,608,751 B2 | * | 8/2003 | Ishimine et al. | 361/679.55 |
| 6,822,856 B2 | * | 11/2004 | Fujiwara | 361/679.48 |
| 6,862,182 B1 | * | 3/2005 | Roman et al. | 361/697 |
| 6,944,022 B1 | * | 9/2005 | Kehret et al. | 361/690 |
| 7,018,169 B2 | * | 3/2006 | Phillip et al. | 415/60 |
| 7,508,682 B2 | * | 3/2009 | Badarinarayan et al. | 361/797 |
| 8,059,401 B2 | * | 11/2011 | Guan | 361/692 |

FOREIGN PATENT DOCUMENTS

| | | |
|---|---|---|
| JP | 10-229287 | 8/1998 |
| JP | 11-355623 | 12/1999 |
| JP | 2005-085908 | 3/2005 |
| JP | 2005-251916 | 9/2005 |
| WO | 01/81224 | 11/2001 |

* cited by examiner

*Primary Examiner* — Boris Chervinsky
(74) *Attorney, Agent, or Firm* — Hamre, Schumann, Mueller & Larson, P.C.

(57) ABSTRACT

A cooling structure (10A) for an electronic device includes: a housing provided with an air inlet and an air outlet; a fan; and a circuit board (2) disposed in the housing. A heat generating component (3) is mounted on one surface of the circuit board (2). A heat release member (4) having fins (45) and a heat transfer plate (41) is disposed between the one surface of the circuit board (2) and an opposite wall (12) of the housing. The heat release member (4) extends, in an arrangement direction of the fins (45), beyond both sides of the heat generating component (3). For example, in an intermediate zone, a resistant layer (8) for suppressing heat transfer from the fins (45) to the opposite wall (12) is formed between the opposite wall (12) and the fins (45).

14 Claims, 12 Drawing Sheets

Prior Art

Prior Art

ELECTRONIC DEVICE COOLING STRUCTURE

TECHNICAL FIELD

The present invention relates to a cooling structure for an electronic device incorporating a heat generating component.

BACKGROUND ART

Generally, a heat generating component, such as a large scale integration circuit, which is a so-called LSI, and a microprocessor, is mounted on a circuit board included in an electronic device. In recent years, the heat generating component has been reduced in size and increased in operation frequency, and thus it tends to generate a larger amount of heat. Accordingly, there has been a demand for an effective solution for cooling the heat generating component.

For example, Patent Literature 1 discloses a cooling structure for an electronic device as shown in FIG. 16. In the cooling structure shown in FIG. 16, an internal closed-structure housing 105 is disposed in a housing 101. The internal housing 105 accommodates a circuit board 102 on which a heat generating component 103 is mounted. An air passage for cooling 115 is formed between one lateral surface of the internal housing 105 and an inner wall surface of the housing 101. The housing 101 has, on both sides thereof in the extending direction of the air passage for cooling 115, an air inlet 111 and an air outlet 112. A fan 113 is provided at the air outlet 112.

There is further provided in the housing 101 a heat transfer member 104 with one end being in contact with the heat generating component 103 directly or via the internal housing 105 and the other end being located in the air passage for cooling 6. The heat transfer member 104 transfers the heat generated in the heat generating component 103 to the air flowing through the air passage for cooling 115. Thereby, the heat generating component 103 is cooled.

Patent Literature 2 discloses a cooling structure for an electronic device as shown in FIG. 17. In the cooling structure shown in FIG. 17, a pressing member 207 is disposed on an inner wall surface of a housing 201, and the pressing member 207 is covered with a heat diffusing sheet 206. The pressing member 207 presses the heat diffusing sheet 206 against a heat generating component 203 mounted on a circuit board 202. Thereby, the heat generated in the heat generating component 203 escapes to the inner wall surface of the housing 201 via the heat diffusing sheet 206 and the pressing member 207.

Patent Literature 3 discloses an elevator control device 300 as shown in FIG. 18. The elevator control device 300 has a structure for cooling not a small heat generating component mounted on a circuit board but a large heat generating component 303 such as a high power switching element to which a power cable, etc. are connected. That is, in the control device 300, a heat sink 302 having a plurality of fins is disposed on an inner surface of a housing 301 so as to form a flow passage along the inner surface of the housing 301, and the flow passage is connected to a fan 304 with a duct 305. The heat generating component 303 is attached directly to the heat sink 302.

CITATION LIST

Patent Literature

PTL 1: JP 2005-251916 A
PTL 2: JP 10(1998)-229287 A
PTL 3: WO 01/81224 A1

SUMMARY OF INVENTION

Technical Problem

However, the cooling structure for an electronic device shown in FIG. 16 has a problem of high cost because it requires a heat pipe or the like having high heat conductivity as the heat transfer member 104 in order to transfer the heat from the heat generating component 103 to the air passage for cooling 115. Moreover, when the amount of heat generated in the heat generating component 103 is increased, it is necessary to increase the heat radiation area of the heat transfer member 104 and the cross-sectional area of the air passage for cooling 115, which further raises the cost.

In the cooling structure for an electronic device shown in FIG. 17, since the heat generating component 203 is in close contact with the inner wall surface of the housing 201 via the heat diffusing sheet 206 and the pressing member 207, the housing 201 may locally have a high surface temperature right under the heat generating component 203 when the amount of heat generated in the heat generating component 203 is increased.

The heat generating component 303 in the elevator control device 300 shown in FIG. 18 is significantly larger than a heat generating component mounted on a circuit board, and thus it is basically impossible to combine the configuration of FIG. 18 with that of FIG. 17. However, even if the configuration of FIG. 18 is adopted in the configuration of FIG. 17, the housing 201 still may locally have a high surface temperature right under the heat generating component 203.

The present invention has been accomplished in view of the foregoing circumstance. The present invention is intended to provide an electronic device cooling structure capable of, with a relatively low cost configuration, cooling effectively a heat generating component that generates a large amount of heat and suppressing an increase in the surface temperature of a housing.

Solution to Problem

The present invention is a cooling structure for an electronic device incorporating a heat generating component, the cooling structure including: a housing provided with an air inlet and an air outlet; a fan for generating, in the housing, a flow of air traveling from the air inlet to the air outlet; a circuit board disposed in the housing, the heat generating component being mounted on one surface of the circuit board; and a heat release member disposed between the one surface of the circuit board and an opposite wall of the housing facing the one surface, the heat release member having fins arranged on the opposite wall and forming a flow passage through which the air flowing in the housing passes, and a heat transfer plate for transferring heat generated in the heat generating component to the fins. The heat release member extends, in an arrangement direction of the fins, beyond both sides of the heat generating component, and the cooling structure satisfies one of items (A) to (D) below.

(A) Between the opposite wall and fins, among the fins, that are located in an intermediate zone including a region corresponding to the heat generating component, a resistant layer for suppressing heat transfer from the fins to the opposite wall is formed.

(B) Each of fins, among the fins, that are located in an intermediate zone including a region corresponding to the heat generating component has a through hole penetrating through the fin in a thickness direction of the fin.

(C) An arrangement pitch of fins, among the fins, that are located in an intermediate zone including a region corresponding to the heat generating component is larger than an arrangement pitch of fins that are located outside the intermediate zone.

(D) In an intermediate zone including a region corresponding to the heat generating component, the opposite wall has a plurality of through holes for reducing a contact area between the fins and itself.

Here, the "heat generating component" refers to an electronic component that generates a relatively large amount of heat (for example, an electronic component that generates 4 W or more of heat). Specific examples thereof include a semiconductor package in which a semiconductor chip is covered with a sealing resin. The "intermediate zone" refers to a zone, in the arrangement direction of the fins, that includes at least a region corresponding to the heat generating component 3, with a specified number of the fins being left on both sides of itself.

Advantageous Effects of Invention

The above-mentioned configuration allows the heat generated in the heat generating component to escape to the housing via the heat release member. Furthermore, the heat generated in the heat generating component is transferred from the fins to the air flowing in the housing in the course of being conducted to the housing. Therefore, with the low cost configuration achieved by the heat release member having the fins, the present invention makes it possible to cool effectively the heat generating component even in the case where the heat generating component generates a large amount of heat. Moreover, with the above-mentioned configurations (A) to (D), the present invention makes it possible to suppress the amount of heat transferred from the fins to the opposite wall in at least the region corresponding to the heat generating component while ensuring satisfactory heat conduction to the opposite wall through the fins on the both sides of the intermediate zone. Thereby, it is possible to suppress an increase in the surface temperature of the housing even in the case where the heat generating component generates a large amount of heat.

DESCRIPTION OF EMBODIMENTS

Hereinafter, embodiments of the present invention will be described with reference to the drawings.

(Embodiment 1)

Figure 1:
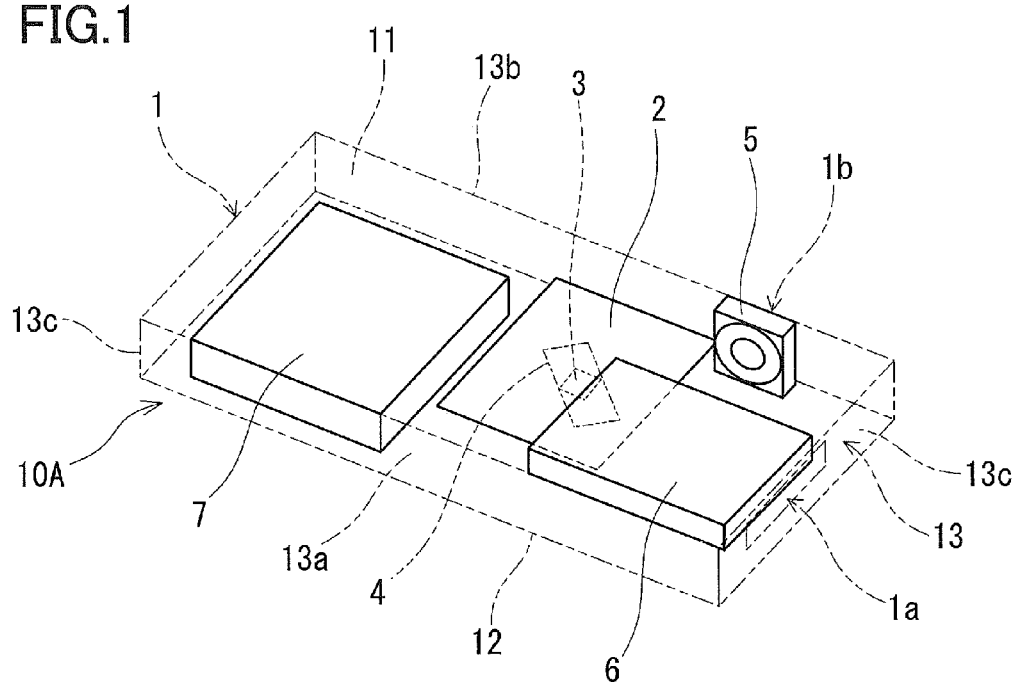
FIG. 1 is a perspective view showing a cooling structure for an electronic device according to Embodiment 1 of the present invention.
Figure 2:
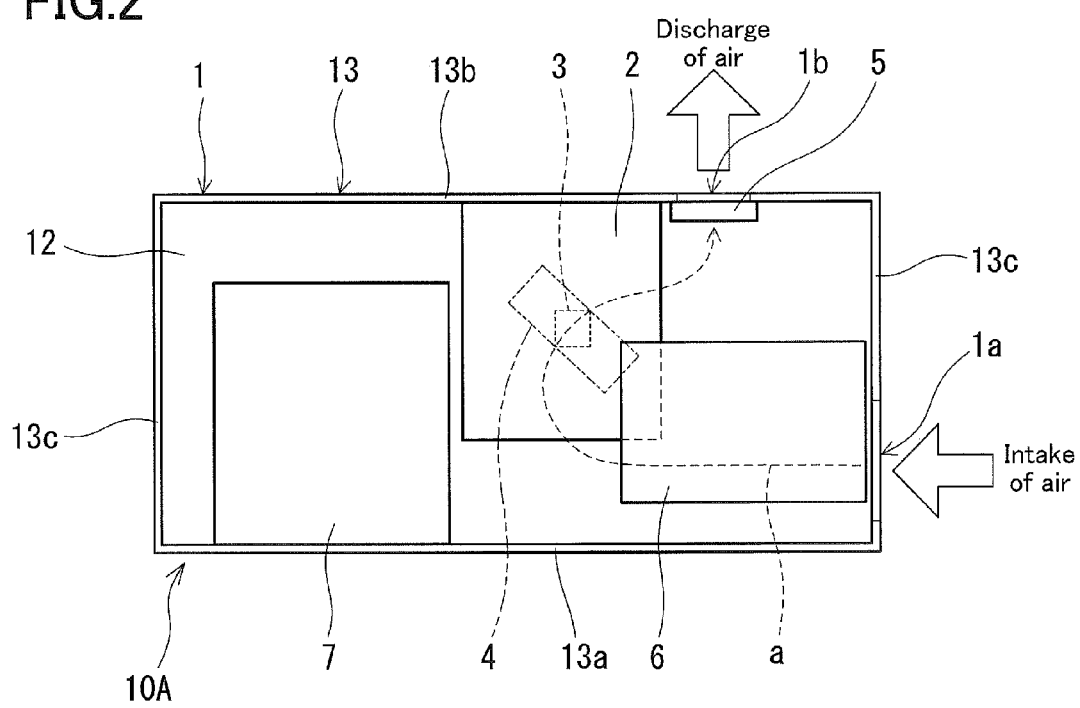
FIG. 2 is a plan view showing the cooling structure for an electronic device according to Embodiment 1 of the present invention.

FIG. 1 and FIG. 2 show a cooling structure 10A for an electronic device according to Embodiment 1 of the present invention. The present embodiment describes an embodiment in which the present invention is applied to a Blu-ray recorder including a storage device 6 and a drive mechanism 7. However, the present invention can be also applied, for example, to other electronic devices such as DVD recorders and CD players.

Specifically, the cooling structure 10A in the present embodiment includes a housing 1 having a box shape flattened in the vertical direction and accommodating the storage device 6 and the drive mechanism 7. The housing 1 has a rectangular cylindrical peripheral wall 13 extending in the vertical direction, and a ceiling wall 11 and a bottom wall (corresponding to the opposite wall of the present invention) 12 closing a space surrounded by the peripheral wall 13 from top and bottom, respectively. In FIG. 1, the housing 1 is illustrated with two-dot chain lines in order to clarify the internal configuration of the electronic device.

The peripheral wall 13 is in a rectangular frame shape in plan view. The peripheral wall 13 has a pair of long side portions 13a and 13b that form a front surface and a back surface of the housing 1, respectively, and a pair of short side portions 13c that form a right lateral surface and a left lateral surface of the housing 1, respectively. The ceiling wall 11 forms an upper surface of the housing 1. The bottom wall 12 forms an undersurface of the housing 1.

The drive mechanism 7 is disposed at a left position in the housing 1. A Blu-ray disc can be inserted into the drive mechanism 7 through the front surface of the housing 1. The storage device 6 is disposed at a right position in the housing 1, spaced apart from the bottom wall 12 (see FIG. 3).

Furthermore, in the housing 1, a circuit board 2 is disposed substantially horizontally between the drive mechanism 7 and the storage device 6 so as to form a specified gap (about 4 to 8 mm, for example) between the circuit board 2 and the bottom wall 12. The circuit board 2 is located below the storage device 6 and overlaps partly with the storage device 6. A heat generating component 3 is mounted on an undersurface of the circuit board 2 facing the bottom wall 12.

An air inlet 1a for taking the outside air into the housing 1 is provided to the short side portion 13c of the peripheral wall 13 forming the right lateral surface of the housing 1, at a position right of the storage device 6. An air outlet 1b for discharging the air in the housing 1 to the outside is provided to the long side portion 13b of the peripheral wall 13 forming the back surface of the housing 1, at a position behind the storage device 6. Although the air inlet 1a and the air outlet 1b each are actually composed of a plurality of ventilation holes, they each are indicated by one rectangle in the figure for simplification.

Figure 3:
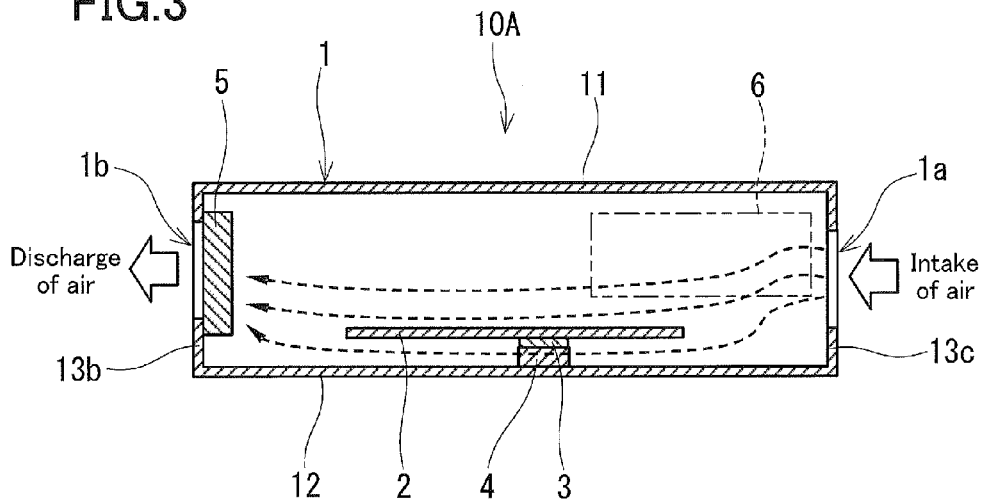
FIG. 3 is a schematic cross-sectional view taken along a passage a shown in FIG. 2.

Furthermore, a fan 5 is attached to an inner surface of the long side portion 13b of the peripheral wall 13 so as to overlap with the air outlet 1b. When the fan 5 is operated, a flow of air traveling from the air inlet 1a to the air outlet 1b is generated in the housing 1 as shown by an arrow a in FIG. 2. As shown in FIG. 3, this flow of air is generated both above and under the circuit board 2. FIG. 3 is a schematic cross-sectional view taken along the passage a shown in FIG. 2.

In the present embodiment, a heat release member 4 is disposed between the undersurface of the circuit board 2 and the bottom wall 12 of the housing 1 so as to be in contact with both the bottom wall 12 and the heat generating component 3 mounted on the undersurface of the circuit board 2. The heat release member 4 is rectangular in plan view, and has a configuration that allows air to flow therethrough in the shorter direction perpendicular to the longer direction. The heat release member 4 thus configured is interposed between the bottom wall 12 of the housing 1 and the heat generating component 3 so as to form a heat conductive path through which the heat generated in the heat generating component 3 escapes to the bottom wall 12 and a convection path through which the heat generated in the heat generating component 3 is transferred to the air flowing between the bottom wall 12 and the circuit board 2. Thereby, effective cooling can be achieved.

Figure 4A:
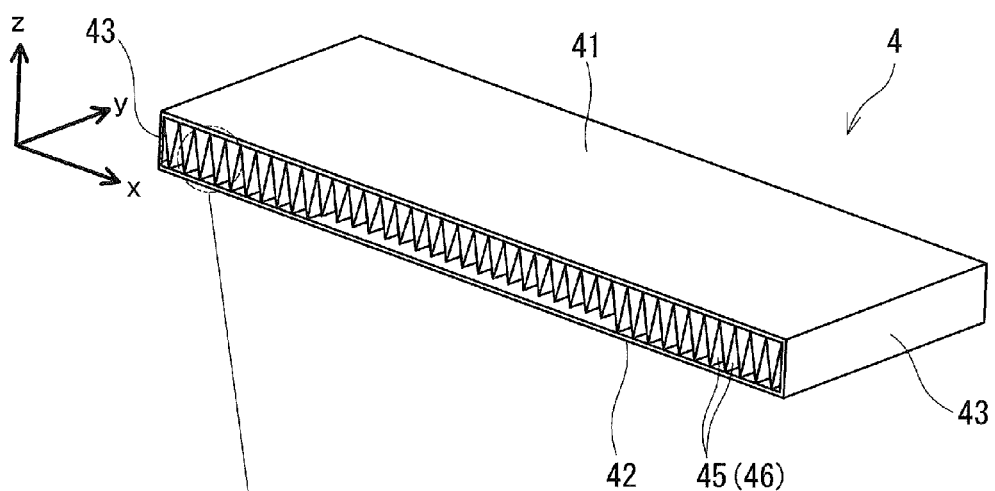
FIG. 4A is a perspective view of a heat release member in Embodiment 1 of the present invention.

Specifically, as shown in FIG. 4A, the heat release member 4 has fins 45 arranged in a specified direction, a heat transfer plate 41 for transferring the heat generated in the heat generating component 3 to the fins 45, and a support plate 42 sandwiching the fins 45 between the heat transfer plate 41 and itself. That is, in the present embodiment, the fins 45 are placed on the bottom wall 12 via the support plate 42. The arrangement direction of the fins 45 (x direction in FIG. 4A) is the above-mentioned longer direction of the heat release member 4. A direction perpendicular to the arrangement direction of the fins 45 (y direction in FIG. 4A) along the heat transfer plate 41 (in other words, on a horizontal plane) is the above-mentioned shorter direction of the heat release member 4. That is, the heat transfer plate 41 and the support plate 42 each have a rectangular plate shape extending in the arrangement direction of the fins 45. End portions, in the longer direction, of the heat transfer plate 41 are connected to end portions, in the longer direction, of the support plate 42, respectively, by a pair of vertical plates 43 facing each other with the fins 45 being sandwiched therebetween.

The length of the heat release member 4 is set to be sufficiently larger than the width of the heat generating component 3, so that the heat release member 4 extends, in the arrangement direction of the fins 45, beyond both sides of the heat generating component 3 (see FIG. 2). Moreover, the heat release member 4 is disposed in a posture that allows a flow passage formed between adjacent ones of the fins 45 to lie along the flow of air (the arrow a in FIG. 2) in the housing 1. In the present embodiment, the longer direction of the heat release member 4 is approximately perpendicular to the passage a. This allows the air flowing in the housing 1 to pass smoothly through the flow passage between adjacent ones of the fins 45.

Figure 4B:
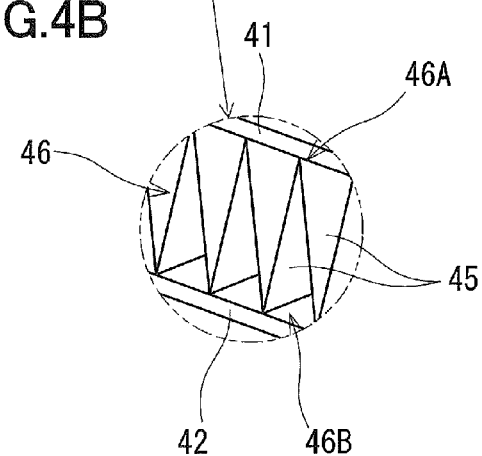
FIG. 4B is a partially enlarged view thereof.

In the present embodiment, as shown in FIG. 4B, the fins 45 constitute a corrugated fin 46 in which upper end portions of adjacent ones of the fins 45 are connected to each other and lower end portions of adjacent ones of the fins 45 are connected to each other, alternately, so that a peak 46A and a trough 46B are repeated alternately. Although the fins 45 each are inclined alternately to the opposite side in the present embodiment, all of the fins 45 may be parallel to each other.

Figure 5:
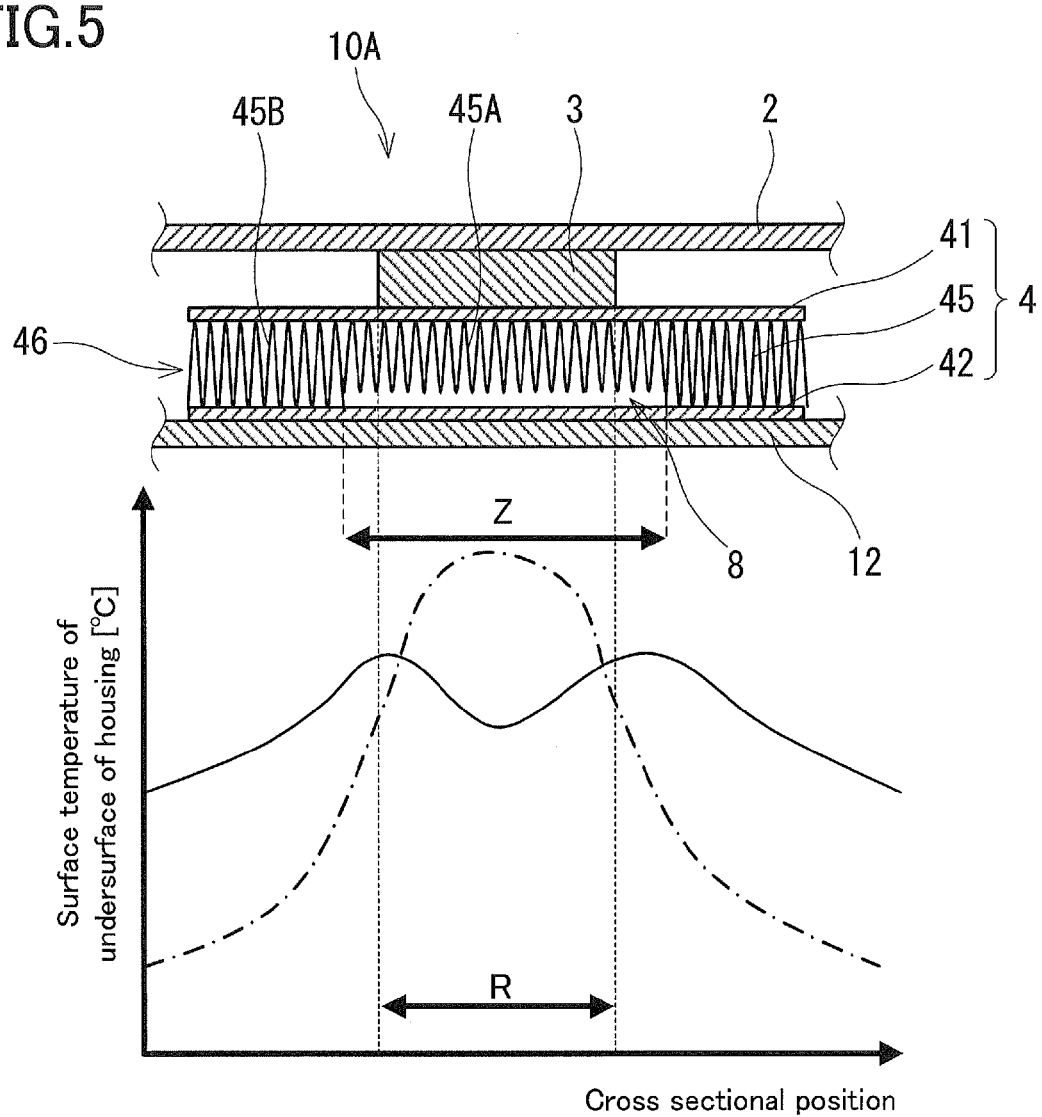
FIG. 5 provides a cross-sectional view of the cooling structure for an electronic device according to Embodiment 1 of the present invention, and a graph showing temperature distributions on an undersurface of a housing.

The corrugated fin 46 is joined, by blazing, to the heat transfer plate 41 at the peaks 46A, and to the support plate 42 at the troughs 46B outside an intermediate zone Z (see FIG. 5). However, they may be joined together by plating, electropainting and mechanical caulking, and by use of an adhesive with high heat conductivity.

As the material composing the corrugated fin 46, an aluminum flat plate with a thickness of 0.08 to 0.2 mm can be used suitably, for example. However, any material can be used as long as it is a metal material with high heat conductivity. Moreover, in order to accelerate the heat transfer by radiation, it is preferable to apply a black alumite treatment or a coating for increasing the radiation rate to a surface of the corrugated fin 46.

The heat transfer plate 41 is, at the center thereof, in surface contact with the heat generating component 3. The support plate 42 is entirely in surface contact with the bottom wall 12. Preferably, a grease or the like with high heat conductivity is applied between the heat generating component 3 and the heat transfer plate 41 and between the support plate 42 and the bottom wall 12 from the viewpoint of reducing contact heat resistance. The support plate 42 is fixed to the bottom wall 12 with screws, for example.

Furthermore, as shown in FIG. 5, between the bottom wall 12 and fins 45A, among the fins 45, that are located in the intermediate zone Z including a region R corresponding to the heat generating component 3 (that is, a region right under the heat generating component 3), a resistant layer 8 for suppressing heat transfer from the fins 45A to the bottom wall 12 is formed in the present embodiment. The length of the intermediate zone Z may be equal to or larger than that of the region R corresponding to the heat generating component 3.

In the present embodiment, the resistant layer 8 is an air layer, and this air layer is a gap formed between the fins 45 and the support plate 42. Specifically, in the intermediate zone Z, the height of the corrugated fin 46 is set to be smaller than the distance between the heat transfer plate 41 and the support plate 42 so that the gap defining the resistant layer 8 is formed between the fins 45A, among the fins 45, that are located in the intermediate zone Z and the support plate 42. That is, the fins 45A located in the intermediate zone Z have a different height from that of fins 45B located on both sides of the intermediate zone Z. The height of the gap varies depending on the method of joining the support plate 42 to the corrugated fin 46. For example, it may be 0.1 mm or more in the case of joining them by blazing.

In the cooling structure 10A described above, the heat generated in the heat generating component 3 can escape to the bottom wall 12 of the housing 1 via the heat release member 4. Furthermore, the heat generated in the heat generating component 3 is transferred from the fins 45 to the air flowing in the housing 1 in the course of being conducted to the bottom wall 12. Therefore, with the low cost configuration achieved by the heat release member 4 having the fins 45, the present embodiment makes it possible to cool effectively the heat generating component 3 even in the case where the heat generating component 3 generates a large amount of heat.

Moreover, since the heat release member 4 extends, in the arrangement direction of the fins 45, beyond both sides of the heat generating component 3, the heat release member 4 can lead the heat generated in the heat generating component 3 to the bottom wall 12 while diffusing the heat broadly. Therefore, the heat release by convection and the heat release by the radiation from the undersurface of the housing 1 can be performed further effectively.

Moreover, since the resistant layer 8, which is an air layer, is formed between the fins 45A and the support plate 42 in the intermediate zone Z, the amount of heat transferred from the fins 45A to the bottom wall 12 is suppressed in at least the region corresponding to the heat generating component 3 while satisfactory heat conduction to the bottom wall 12 through the fins 45B is ensured on both sides of the intermediate zone Z. As a result, it is possible to suppress an increase in the surface temperature of the undersurface of the housing 1 even in the case where the heat generating component 3 generates a large amount of heat.

Furthermore, in the present embodiment, since the corrugated fin 46 is used, the production cost can be reduced more than in the case where each of the fins 45 is joined to the heat transfer plate 41 and the support plate 42.

Figure 6:
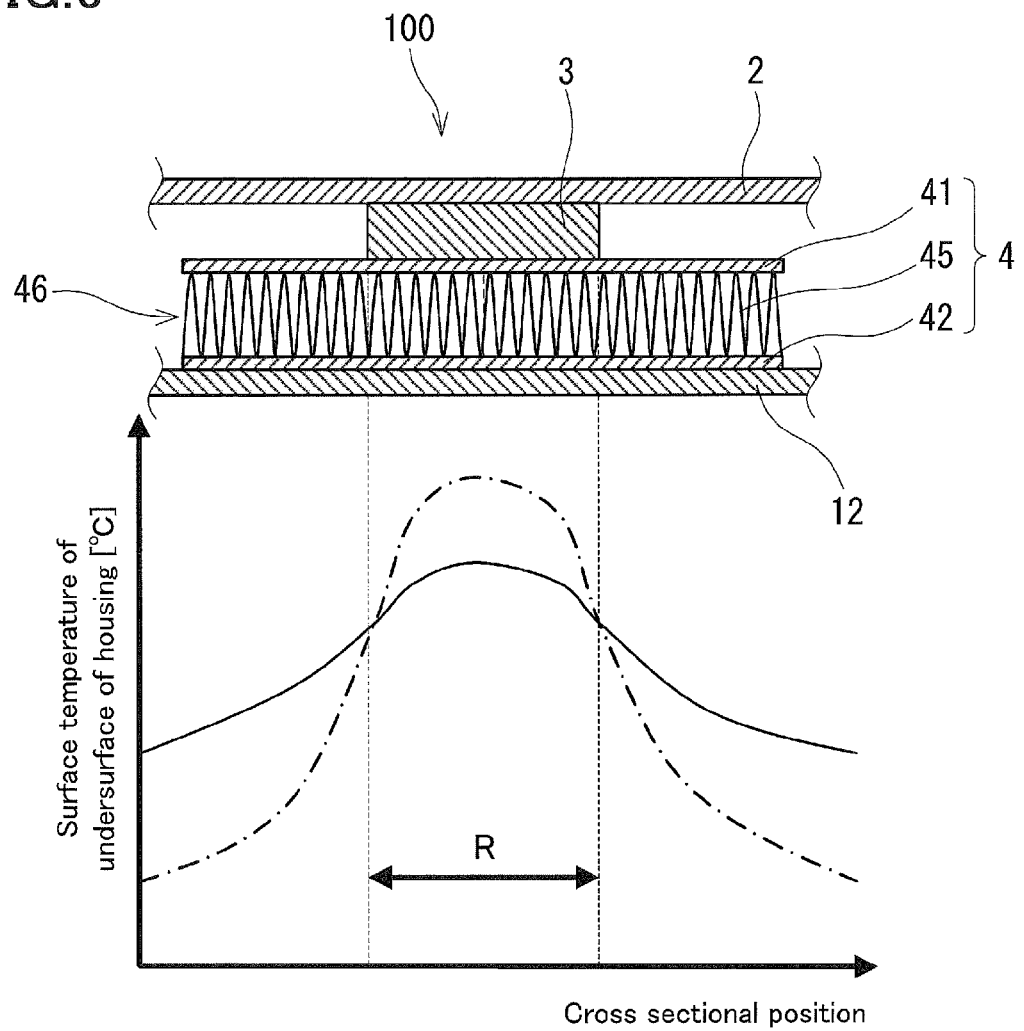
FIG. 6 provides a cross-sectional view of a cooling structure for an electronic device in a comparative example, and a graph showing temperature distributions on an undersurface of a housing.

Here, the effects of the present embodiment are described in detail with reference to the graph in FIG. 5. Before that, with reference to FIG. 6, a description is made with regard to a cooling structure 100 for an electronic device as a comparative example in which the resistant layer 8 is not provided and all of the fins 45 are in contact with the support plate 42.

Assume that the amount of heat generated in the heat generating component 3 is 15 W. In the case where the heat generating component 3 is in close contact with the bottom wall 12 via, for example, a heat conductive rubber, the surface temperature of the undersurface of the housing 1 is locally increased right under the heat generating component 3 with the peak exceeding 70° C. as shown by the dashed dotted line in FIG. 6. In the case where all of the fins 45 are in contact with the support plate 42 as in the case of the cooling structure 100 of the comparative example, the surface temperature of the undersurface of the housing 1 is equal to or lower than a specified temperature (70° C., for example) but it is still high as shown by the solid line in FIG. 6.

In contrast, in the cooling structure 10A of the present embodiment, although the heat generated in the heat generating component 3 is transferred to all of the fins 45 via the heat transfer plate 41, the heat release from the fins 45A is performed only by air convection and no heat transfer to the support plate 42 occurs in the intermediate zone Z. Thus, the heat transferred from the fins 45B located outside the intermediate zone Z to the support plate 42 by heat conduction is conducted to the part of the support plate 42 in the intermediate zone Z. As a result, the peak of the surface temperature of the undersurface of the housing 1 can be lowered further as shown in FIG. 5. Thereby, it is possible to achieve effective cooling while allowing the undersurface of the housing 1 right under the heat generating component 3, at which the temperature becomes highest, to have a surface temperature equal to or lower than a specified value.

Although the gap is formed between the fins 45A located in the intermediate zone Z and the support plate 42 in the present embodiment, the gap may be formed between the fins 45A located in the intermediate zone Z and the heat transfer plate 41. Moreover, the length of the intermediate zone Z may be determined appropriately according to the amount of heat generated so that the temperatures of the heat generating component 3 and the undersurface of the housing 1 are equal to or lower than desired temperatures.

<Modifications>

Although the height difference of the corrugated fin 46 forms the gap between the fins 45A located in the intermediate zone Z and the support plate 42 in the above-mentioned embodiment, the configuration for forming the gap between the fins 45A located in the intermediate zone Z and the support plate 42 is not limited to this. Hereinafter, Modification 1 and Modification 2 are described as other configuration examples.

[Modification 1]

Figure 7:
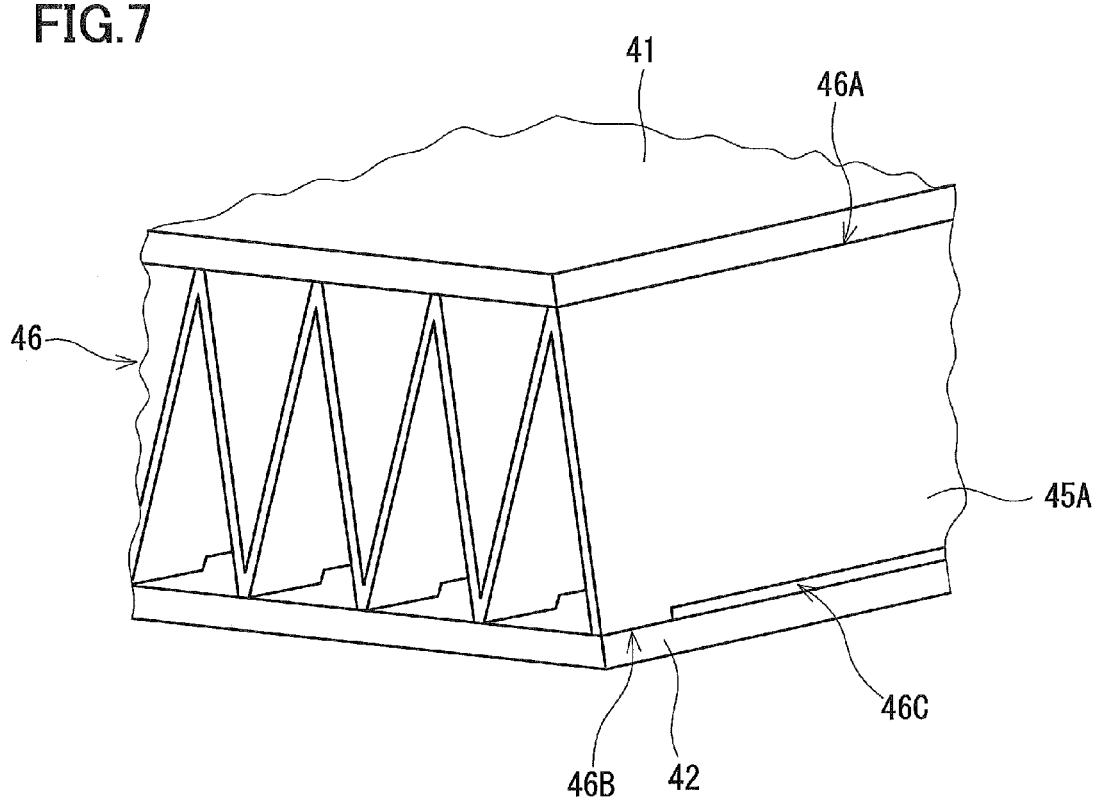
FIG. 7 is an enlarged perspective view of an essential part of a heat release member in Modification 1 of Embodiment 1.

In case of Modification 1 shown in FIG. 7, each of the troughs 46B of the corrugated fin 46 has a recessed portion 46C opening downwardly (toward the bottom wall 12) in the intermediate zone Z. The recessed portions 46C can be formed at the same time when the corrugated fin 46 is produced by press-processing a raw metal plate. Alternatively, it is also possible to form the recessed portions 46C by cutting out or crushing the troughs 46B of the produced corrugated fin 46. That is, the recessed portions 46C may or may not be bottom-closed.

The recessed portions 46C thus provided also can form the gap that defines the resistant layer 8, which is an air layer, between the fins 45A located in the intermediate zone Z and the support plate 42. Thereby, the same effects as in the above-mentioned embodiment can be obtained. The shape and dimensions of the recessed portions 46C may be determined appropriately according to the amount of heat generated so that the temperatures of the heat generating component 3 and the undersurface of the housing 1 are equal to or lower than desired temperatures.

[Modification 2]

Figure 8A:
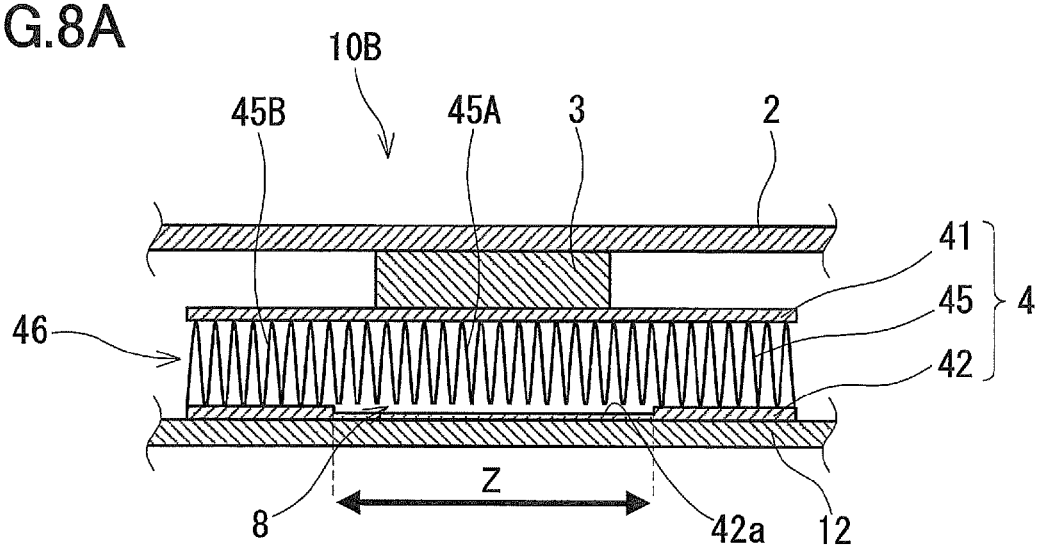
FIG. 8A is a cross-sectional view of a cooling structure for an electronic device of Modification 2 of Embodiment 1.
Figure 8B:
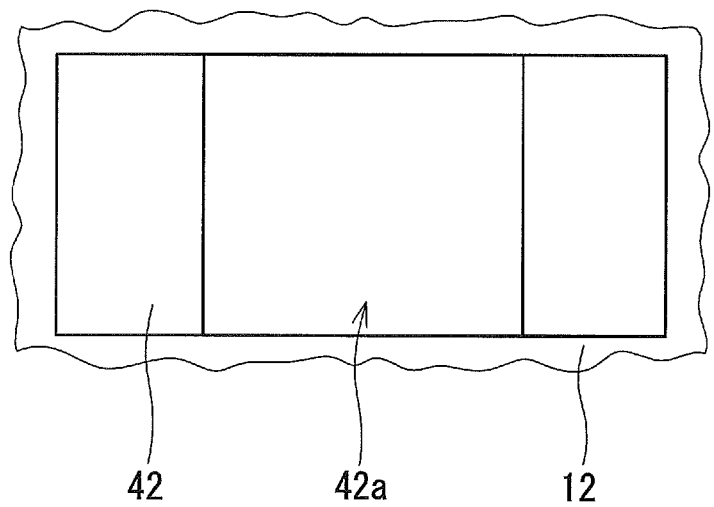
FIG. 8B is a plan view of a support plate of a heat release member in Modification 2 of Embodiment 1.

In case of a cooling structure 10B of Modification 2 shown in FIGS. 8A and 8B, in the intermediate zone Z, the support plate 42 has, in an upper surface thereof, a groove 42a extending in the direction perpendicular to the arrangement direction of the fins 45 and opening on both end faces of the support plate 42. The depth of the groove 42a varies depending on the method of joining the support plate 42 to the corrugated fin 46. For example, it may be 0.1 mm or more in the case of joining them by blazing. The groove 42a may be formed by selecting properly a processing method, such as electron discharge, etching and cutting, according to the depth of the groove.

The groove 42a thus provided also can form the gap that defines the resistant layer 8, which is an air layer, between the fins 45A located in the intermediate zone Z and the support plate 42. Thereby, the same effects as in the above-mentioned embodiment can be obtained. Although the groove 42a is rectangular in plan view in the present Modification 2, the groove 42a may have another shape taking mass production into consideration. Moreover, the groove 42a does not necessarily have to open on the both end faces of the support plate 42. The length (that is, the dimension in the direction perpendicular to the arrangement direction of the fins 45) of the groove 42a may be determined appropriately according to the amount of heat generated so that the temperatures of the heat generating component 3 and the undersurface of the housing 1 are equal to or lower than desired temperatures.

As another modification, in the case where the corrugated fin 46 is not used and each of the fins 45 is joined to the heat transfer plate 42, fins cut out at lower end or fins having a smaller height may be used in the intermediate zone Z.

[Modification 3]

Figure 9:
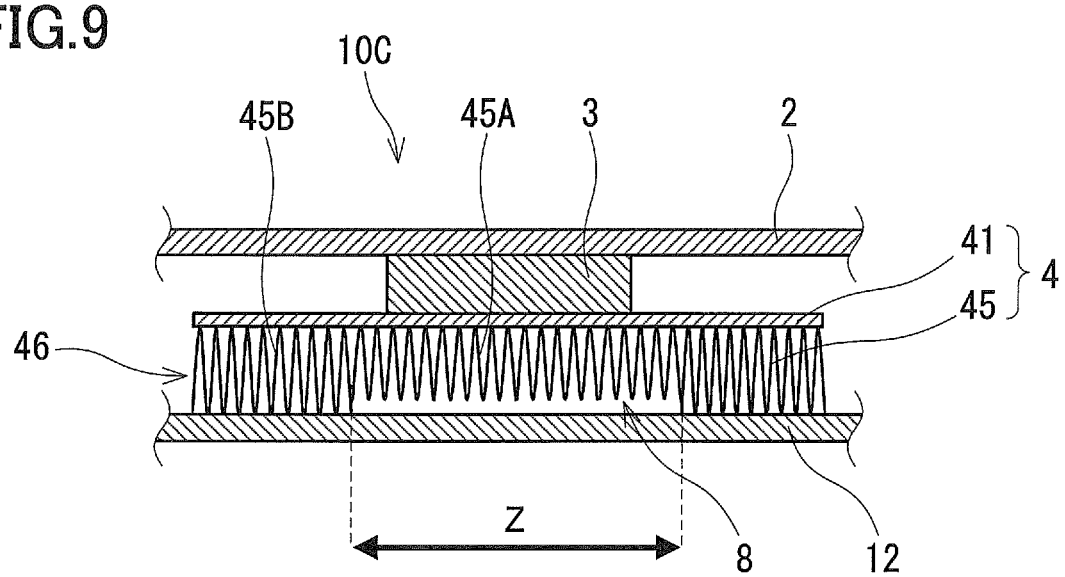
FIG. 9 is a cross-sectional view of a cooling structure for an electronic device of Modification 3 of Embodiment 1.

Alternatively, as in a cooling structure 10C of Modification 3 shown in FIG. 9, it is possible to omit the support plate 42, join the corrugated fin 46 directly to the bottom wall 12 of the housing 1, and sandwich the fins 45 between the heat transfer plate 41 and the bottom wall 12 of the housing 1 (in other words, place the fins 45 directly on the bottom wall 12). In this case, as shown in FIG. 9, the gap that defines the resistant layer 8, which is an air layer, may be formed between the fins 45A, among the fins 45, that are located in the intermediate zone Z and the bottom wall 12 by setting, in the intermediate zone Z, the height of the corrugated fin 46 to be smaller than a distance between the heat transfer plate 41 and the bottom wall 12. In this case, the corrugated fin 46 may be joined to the bottom wall 12 at the troughs 46B outside the intermediate zone Z also by blazing or the like, as in the above-mentioned embodiment.

Alternatively, as shown in FIG. 7, the recessed portion 46C opening downwardly may be formed in each of the troughs 46B of the corrugated fin 46 in the intermediate zone Z.

[Modification 4]

Figure 10:
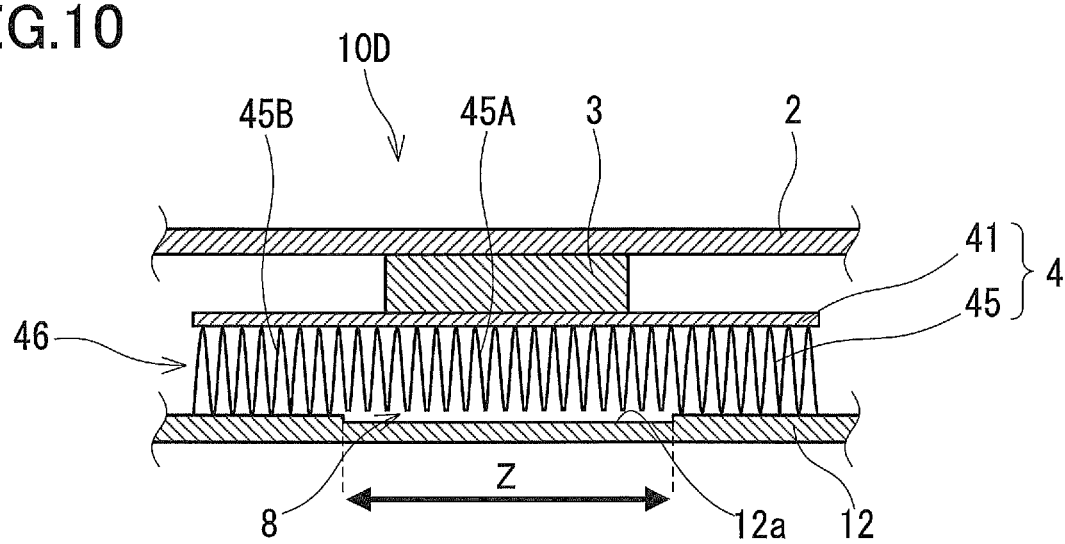
FIG. 10 is a cross-sectional view of a cooling structure for an electronic device of Modification 4 of Embodiment 1.

Furthermore, as in a cooling structure 10D of Modification 4 shown in FIG. 10, the bottom wall 12 may have, in an upper surface thereof, a depression 12a opening upwardly in the intermediate zone Z. The depression 12a thus provided also can form the gap that defines the resistant layer 8, which is an air layer, between the fins 45A located in the intermediate zone Z and the support plate 42. Thereby, the same effects as in the above-mentioned embodiment can be obtained.

The resistant layer 8 does not necessarily have to be an air layer, and it may be formed of a resin having a lower heat conductivity than that of the fins 45. For example, the groove 42a and the depression 12a may be filled with such a resin in the cooling structure 10B shown in FIG. 8A and the cooling structure 10D shown in FIG. 10, respectively. Alternatively, the resistant layer 8 may be a metal plate made of the same material as that of the fins 45 and having many through holes. As described above, the resistant layer 8 may have any configuration as long as it has a function of suppressing the heat transfer from the fins 45 to the bottom wall 12.

(Embodiment 2)

Figure 11:
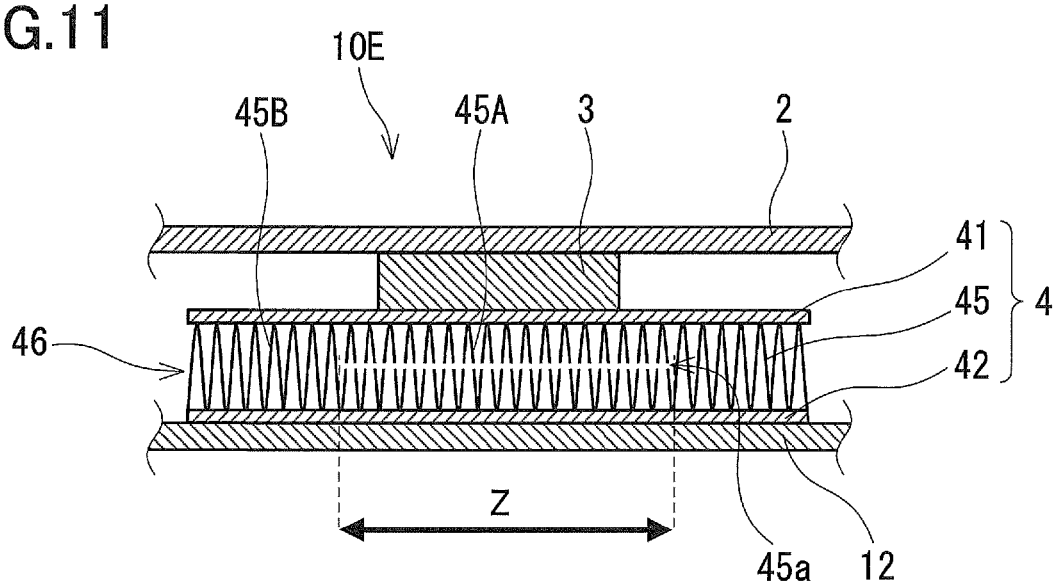
FIG. 11 is a cross-sectional view of a cooling structure for an electronic device according to Embodiment 2 of the present invention.

FIG. 11 shows a cooling structure 10E for an electronic device according to Embodiment 2 of the present invention. In the present embodiment, descriptions are omitted with regard to the same content as in Embodiment 1 (for example, the configuration of the housing 1, and the positions of the circuit board 2 and the heat release member 4). This is also the case with Embodiment 3 and the other embodiments described below.

In the present embodiment, each of the fins 45A, among the fins 45, that are located in the intermediate zone Z has a through hole penetrating through the fin 45A in the thickness direction of the fin 45A. The through holes each are a slit 45a extending, along the heat transfer plate 41, in the direction perpendicular to the arrangement direction of the fins 45.

For example, the slit 45a may have a length that is slightly shorter than the width of each fin 45 so as to section the fin 45 vertically. Or the slit 45a may be divided into portions so that they are arranged along a horizontal line on the fin 45. The vertical position of the slit 45a is not particularly limited. The slits 45a can be formed at the same time when the corrugated fin 46 is produced by press-processing a raw metal plate. Alternatively, it is also possible to form the slits 45a by applying, for example, an electron discharge processing to the produced corrugated fin 46.

Although the heat generated in the heat generating component 3 is transferred to all of the fins 45 via the heat transfer plate 41, the amount of heat transferred from the fins 45A to the support plate 42 and the bottom wall 12 is suppressed because each of the fins 45A located in the intermediate zone Z has the slit 45a. Accordingly, the peak of the surface temperature of the undersurface of the housing 1 can be lowered as in Embodiment 1. Thereby, it is possible to achieve effective cooling while allowing the undersurface of the housing 1 right under the heat generating component 3, at which the temperature becomes highest, to have a surface temperature equal to or lower than a specified value.

Figure 12:
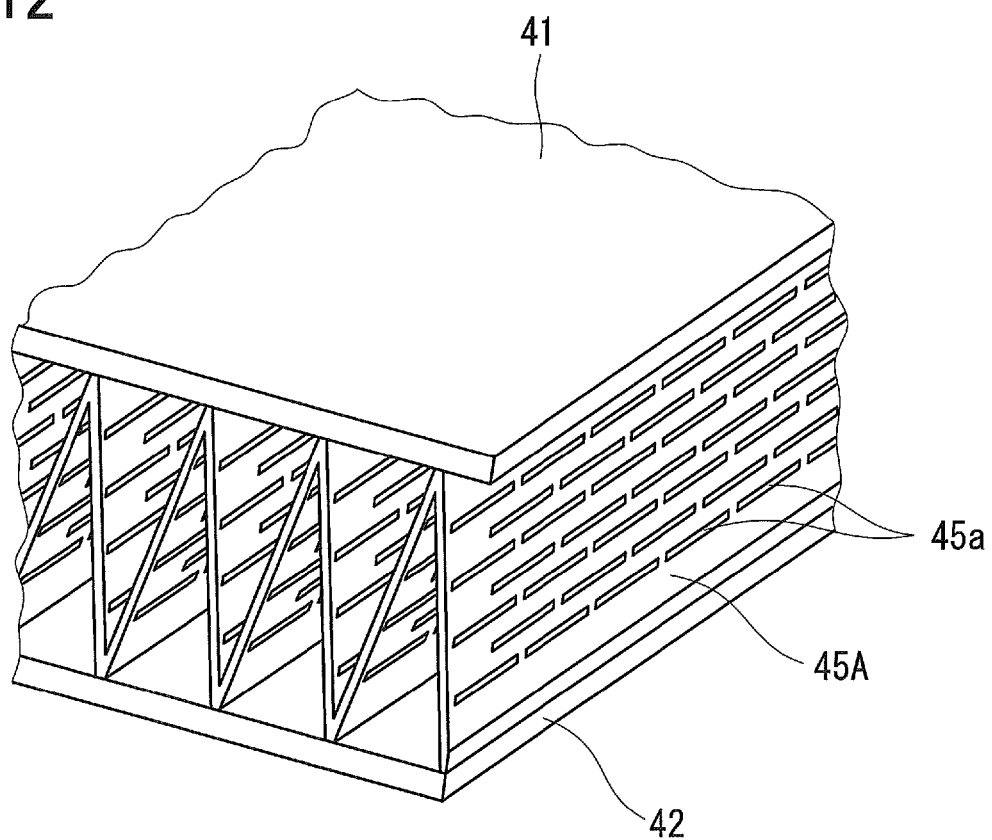
FIG. 12 is an enlarged perspective view of an essential part of a heat release member in Modification 1 of Embodiment 2.

In FIG. 11, one slit 45a is formed at approximate center of each of the fins 45A located in the intermediate zone Z. However, as shown in FIG. 12, for example, a plurality of the slits 45a may be formed staggeredly in each of the fins 45A. Moreover, the slits 45a may be rectangular, or may have another shape taking mass production into consideration. Furthermore, the occupation ratio of the slit 45a in each of the fins 45A may be determined appropriately according to the amount of heat generated so that the temperatures of the heat generating component 3 and the undersurface of the housing 1 are equal to or lower than desired temperatures.

Figure 13:
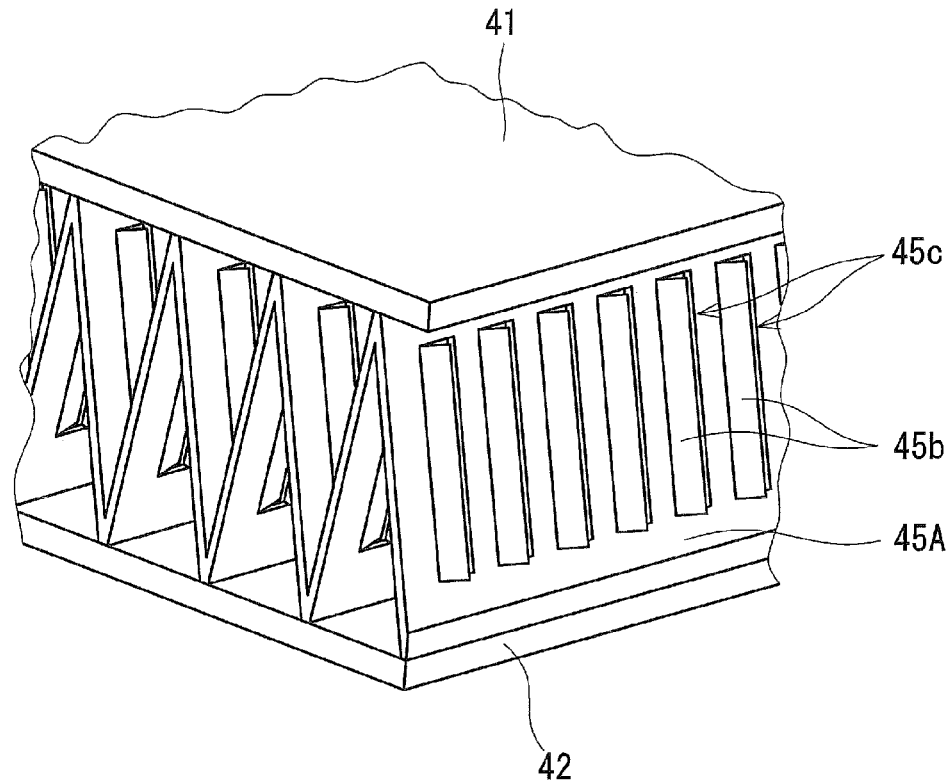
FIG. 13 is an enlarged perspective view of an essential part of a heat release member in Modification 2 of Embodiment 2.

Although the through holes formed in the fins 45A, among the fins 45, that are located in the intermediate zone Z are the slits 45a in the above-mentioned embodiment, the through holes may be openings 45c arranged, along the heat transfer plate 41, in the direction perpendicular to the arrangement direction of the fins 45 as shown in FIG. 13. Preferably, the openings 45c have a shape extending in the thickness direction of the heat transfer plate 41.

In the modification shown in FIG. 13, the openings 45c each are formed by bending up an incised portion of each of the fins 45A, and the bent-up portions form slats 45b. The slats 45b are arranged uniformly at a given inclination angle to construct a louver. The openings 45c and the slats 45b can be formed by press-processing the corrugated fin 46.

Although the heat generated in the heat generating component 3 is transferred to all of the fins 45 via the heat transfer plate 41, the amount of heat transferred from the fins 45A to the support plate 42 and the bottom wall 12 is suppressed because each of the fins 45A located in the intermediate zone Z has the opening 45c. Accordingly, the peak of the surface temperature of the undersurface of the housing 1 can be lowered as in Embodiment 1. Thereby, it is possible to achieve effective cooling while allowing the undersurface of the housing 1 right under the heat generating component 3, at which the temperature becomes highest, to have a surface temperature equal to or lower than a specified value.

Furthermore, in the present embodiment, the slats 45b formed in the fins 45A located in the intermediate zone Z prevent a boundary layer along the fins 45A from growing continuously when the air passes through the flow passage between adjacent ones of the fins 45A. Thereby, it is possible to raise the rate of heat transfer by convection so as to increase the amount of heat release to the air flowing in the housing 1, and suppress further the amount of heat transferred from the fins 45A to the support plate 42 and the bottom wall 12.

Although the slats 45b are rectangular in FIG. 13, they may have another shape taking mass production into consideration. Moreover, the size, quantity and positions of the slats 45b can be selected suitably.

(Embodiment 3)

Figure 14:
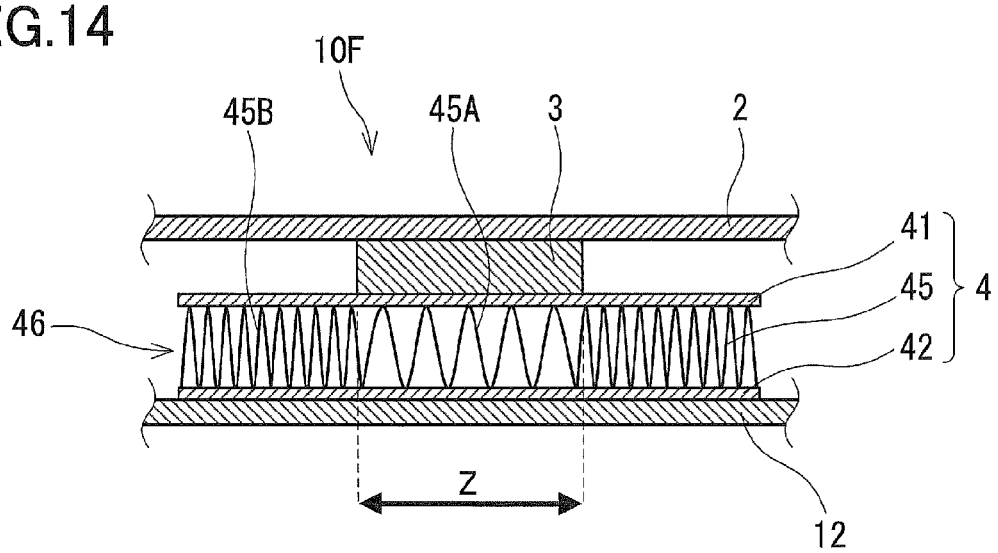
FIG. 14 is a cross-sectional view of a cooling structure for an electronic device according to Embodiment 3 of the present invention.

FIG. 14 shows a cooling structure 10F for an electronic device according to Embodiment 3 of the present invention. In the present embodiment, an arrangement pitch of the fins 45A, among the fins 45, that are located in the intermediate zone Z is set to be larger than an arrangement pitch of the fins 45B that are located outside the intermediate zone Z. In other words, the fins 45 are disposed sparsely in the intermediate zone Z whereas densely outside the intermediate zone Z.

As described above, the fins 45 are disposed sparsely in the intermediate zone Z whereas densely outside the intermediate zone Z, so that the contact area between the heat transfer plate 41 and the fins 45A in the intermediate zone Z is reduced. Accordingly, the amount of heat transferred from the fins 45A to the support plate 42 and the bottom wall 12 is suppressed. Thereby, it is possible to achieve effective cooling while allowing the undersurface of the housing 1 to have a surface temperature equal to or lower than a specified value. The difference between the arrangement pitch of the fins 45A and that of the fins 45B may be determined appropriately according to the amount of heat generated so that the temperatures of the heat generating component 3 and the undersurface of the housing 1 are equal to or lower than desired temperatures. Moreover, the support plate 42 may be omitted as in the modification of Embodiment 1.

(Embodiment 4)

Figure 15A:
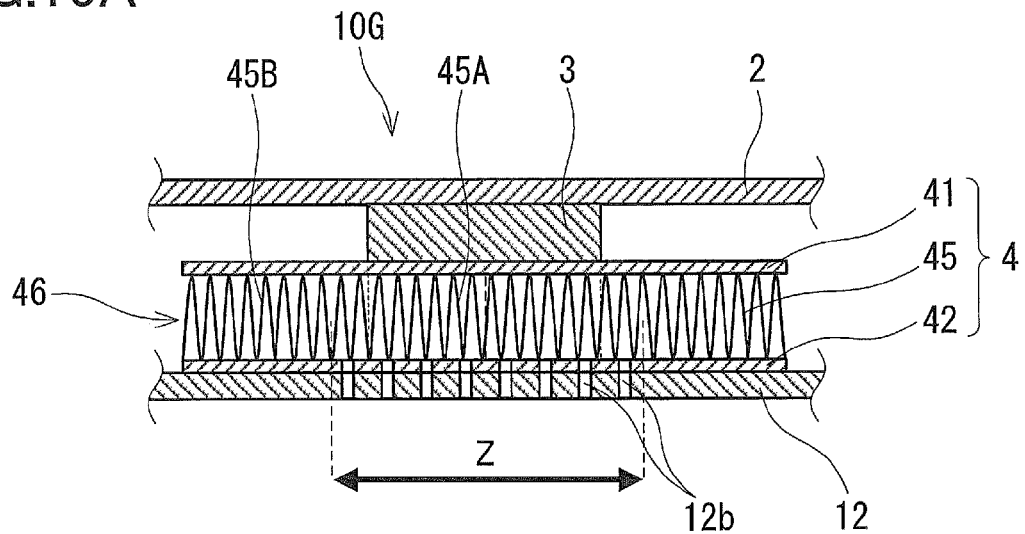
FIG. 15A is a cross-sectional view of a cooling structure for an electronic device according to Embodiment 4 of the present invention.

FIG. 15A shows a cooling structure 10G for an electronic device according to Embodiment 4 of the invention. In the present embodiment, the bottom wall 12 has, in the intermediate zone Z, a plurality of through holes 12b for reducing a contact area between the fins 45A and itself. In the present embodiment, since the fins 45 are placed on the bottom wall 12 via the support plate 42, the support plate 42 also has through holes at positions coinciding with the through holes 12b.

When the bottom wall 12 has, in the intermediate zone Z, the through holes 12b as described above, the amount of heat transferred from the fins 45A to the bottom wall 12 is suppressed. Thereby, it is possible to achieve effective cooling while allowing the undersurface of the housing 1 to have a surface temperature equal to or lower than a specified value. The size and number of the through holes 12b may be determined appropriately according to the amount of heat generated so that the temperatures of the heat generating component 3 and the undersurface of the housing 1 are equal to or lower than desired temperatures.

Figure 15B:
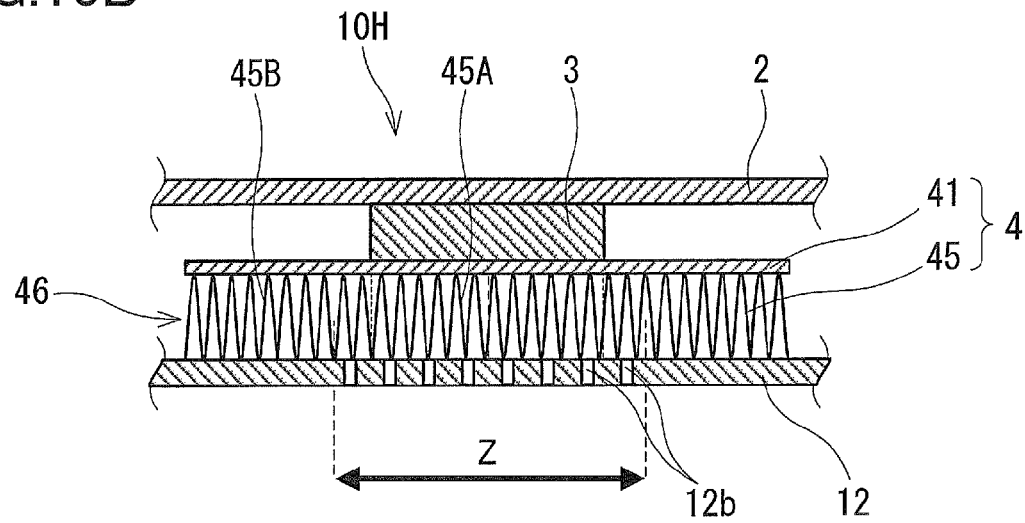
FIG. 15B is a cross-sectional view of a cooling structure for an electronic device of a modification of Embodiment 4.
Figure 16:
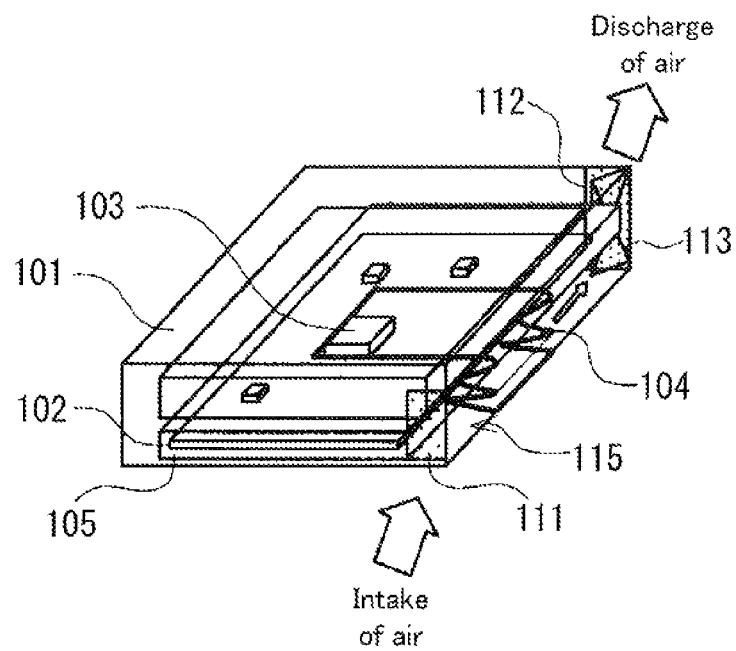
FIG. 16 is a perspective view showing a conventional cooling structure for an electronic device.
Figure 17:
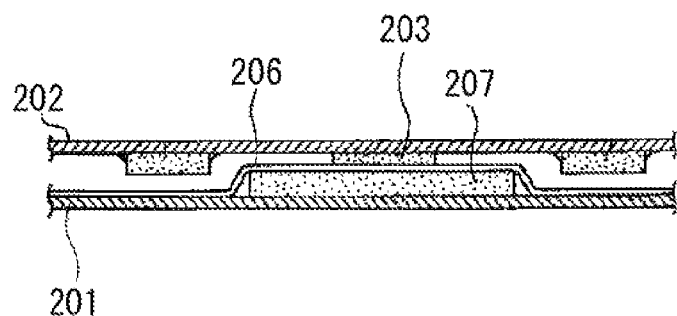
FIG. 17 is a cross-sectional view of another conventional cooling structure for an electronic device.
Figure 18:
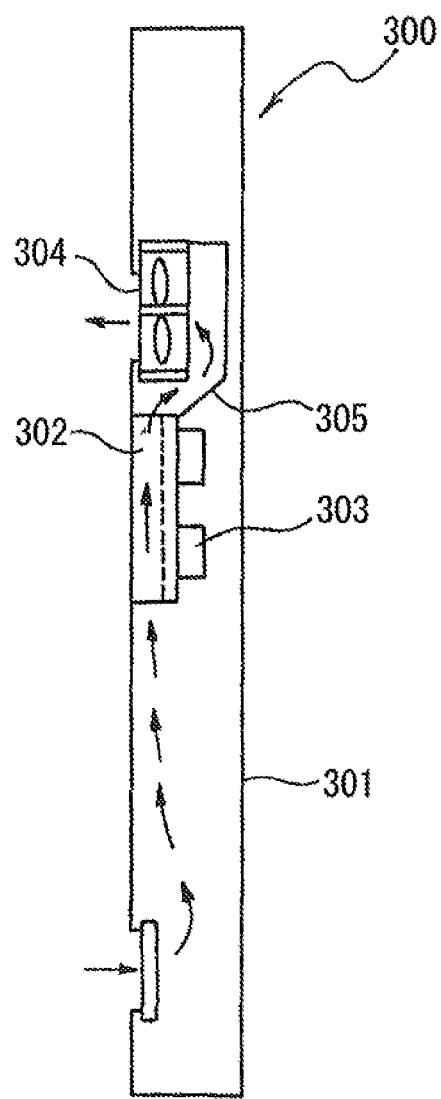
FIG. 18 is a cross-sectional view of a conventional elevator control device.

Needless to say, the same effects as in the above-mentioned embodiments can be obtained even in the case where the support plate 42 is omitted as in a modified cooling structure 10H shown in FIG. 15B.

(Other Embodiments)

In each of the above-mentioned embodiments, the heat release member 4 is disposed between the bottom wall 12 of the housing 1 and the undersurface of the circuit board 2. However, in the case where the circuit board 2 is disposed near the ceiling wall 11 of the housing 1, the heat generating component 3 may be mounted on an upper surface of the circuit board 2, and the heat release member 4 may be disposed between the upper surface of the circuit board 2 and the ceiling wall 11 of the housing 1 so as to be in contact with both the heat generating component 3 and the ceiling wall 11. In this case, the ceiling wall 11 functions as the opposite wall of the present invention.

It should be noted that the upper surface of the housing 1 desirably has a low temperature taking a case into consideration such that a user touches it with his/her hand. Thus, it is more preferable, as in each of the embodiments, that the heat release member 4 is disposed between the bottom wall 12 of the housing 1 and the undersurface of the circuit board 2 so as to release heat to the bottom wall 12 of the housing 1. Furthermore, since the bottom wall 12 generally has a higher rigidity than that of the ceiling wall 11 in order to support the components, the configuration as in each of the embodiments is preferable in that the heat diffusion in a plane direction is performed satisfactory in the housing 1.

INDUSTRIAL APPLICABILITY

The present invention is useful particularly for a cooling structure for an electronic device in which a heat generating component, such as an LSI and a CPU, is included in a housing.

The invention claimed is:

1. A cooling structure for an electronic device incorporating a heat generating component, the cooling structure comprising:
    a housing provided with an air inlet and an air outlet;
    a fan for generating, in the housing, a flow of air traveling from the air inlet to the air outlet;
    a circuit board disposed in the housing, the heat generating component being mounted on one surface of the circuit board; and
    a heat release member disposed between the one surface of the circuit board and an opposite wall of the housing facing the one surface, the heat release member having fins arranged on the opposite wall and forming a flow passage through which the air flowing in the housing passes, and a heat transfer plate for transferring heat generated in the heat generating component to the fins,
    wherein the heat release member extends, in an arrangement direction of the fins, beyond both sides of the heat generating component, and the cooling structure satisfies one of items (A) to (D) below:
    (A) between the opposite wall and fins, among the fins, that are located in an intermediate zone including a region corresponding to the heat generating component, a resistant layer for suppressing heat transfer from the fins to the opposite wall is formed;
    (B) each of fins, among the fins, that are located in an intermediate zone including a region corresponding to the heat generating component has a through hole penetrating through the fin in a thickness direction of the fin;
    (C) an arrangement pitch of fins, among the fins, that are located in an intermediate zone including a region corresponding to the heat generating component is larger than an arrangement pitch of fins that are located outside the intermediate zone; and
    (D) in an intermediate zone including a region corresponding to the heat generating component, the opposite wall has a plurality of through holes for reducing a contact area between the fins and itself.

2. The cooling structure for an electronic device according to claim 1, wherein
    the cooling structure satisfies the item (A), and
    the resistant layer is an air layer.

3. The cooling structure for an electronic device according to claim 2, wherein
    the fins are placed directly on the opposite wall, and
    the air layer is a gap formed between the fins and the opposite wall.

4. The cooling structure for an electronic device according to claim 2, wherein
    the fins are placed on the opposite wall via a support plate, and the air layer is a gap formed between the fins and the support plate.

5. The cooling structure for an electronic device according to claim 3, wherein
the fins constitute a corrugated fin in which first end portions of adjacent ones of the fins are connected to each other and second end portions of adjacent ones of the fins are connected to each other, alternately, so that a peak and a trough are repeated alternately, and
in the intermediate zone, a height of the corrugated fin is set to be smaller than a distance between the heat transfer plate and the opposite wall.

6. The cooling structure for an electronic device according to claim 4, wherein
the fins constitute a corrugated fin in which first end portions of adjacent ones of the fins are connected to each other and second end portions of adjacent ones of the fins are connected to each other, alternately, so that a peak and a trough are repeated alternately, and
in the intermediate zone, a height of the corrugated fin is set to be smaller than a distance between the heat transfer plate and the support plate.

7. The cooling structure for an electronic device according to claim 3, wherein
the fins constitute a corrugated fin in which first end portions of adjacent ones of the fins are connected to each other and second end portions of adjacent ones of the fins are connected to each other, alternately, so that a peak and a trough are repeated alternately, and
in the intermediate zone, each of the troughs of the corrugated fin has a recessed portion opening toward the opposite wall.

8. The cooling structure for an electronic device according to claim 3, wherein
the fins constitute a corrugated fin in which first end portions of adjacent ones of the fins are connected to each other and second end portions of adjacent ones of the fins are connected to each other, alternately, so that a peak and a trough are repeated alternately, and
in the intermediate zone, the opposite wall has, in a surface thereof on a side of the fins, a depression.

9. The cooling structure for an electronic device according to claim 4, wherein
the fins constitute a corrugated fin in which first end portions of adjacent ones of the fins are connected to each other and second end portions of adjacent ones of the fins are connected to each other, alternately, so that a peak and a trough are repeated alternately, and
in the intermediate zone, the support plate has, in a surface thereof on a side of the fins, a groove extending in a direction perpendicular to the arrangement direction of the fins.

10. The cooling structure for an electronic device according to claim 1, wherein
the cooling structure satisfies the item (B), and
the through holes each are a slit extending, along the heat transfer plate, in a direction perpendicular to the arrangement direction of the fins.

11. The cooling structure for an electronic device according to claim 1, wherein
the cooling structure satisfies the item (B), and
the through holes are openings arranged, along the heat transfer plate, in a direction perpendicular to the arrangement direction of the fins.

12. The cooling structure for an electronic device according to claim 11, wherein the openings each are formed by bending up an incised portion of each of the fins, and the bent-up portions form slats.

13. The cooling structure for an electronic device according to claim 10, wherein the fins constitute a corrugated fin in which first end portions of adjacent ones of the fins are connected to each other and second end portions of adjacent ones of the fins are connected to each other, alternately, so that a peak and a trough are repeated alternately.

14. The cooling structure for an electronic device according to claim 1, wherein
the housing has a peripheral wall extending in a vertical direction, and a ceiling wall and a bottom wall closing a space surrounded by the peripheral wall from top and bottom, respectively, and
the one surface of the circuit board is an undersurface facing downward, and the opposite wall is the bottom wall.

* * * * *